United States Patent [19]

Saito et al.

[11] Patent Number: 5,136,970
[45] Date of Patent: Aug. 11, 1992

[54] COATING APPARATUS WITH VERTICALLY MOVABLE SOLUTION RECEIVER

[75] Inventors: Hiroki Saito; Seiji Ishizuka, both of Kanagawa, Japan

[73] Assignee: Fuji Photo Film Co., Ltd., Kanagawa, Japan

[21] Appl. No.: 592,728

[22] Filed: Oct. 4, 1990

[30] Foreign Application Priority Data

Oct. 6, 1989 [JP] Japan .................................. 1-261462
Dec. 15, 1989 [JP] Japan .................................. 1-325176

[51] Int. Cl.$^5$ .............................................. B05C 1/00
[52] U.S. Cl. ............................ 118/324; 118/DIG. 4; 427/420
[58] Field of Search ......... 118/209, 239, 324, DIG. 4; 427/420

[56] References Cited

U.S. PATENT DOCUMENTS 3,303,816 2/1967 Lauring ...................... 118/DIG. 4
4,922,851 5/1990 Morikawa et al. .................. 118/324

OTHER PUBLICATIONS

C. Ham, E. Crane & W. Rogers, Mechanics of Machinery (4th edition, 1958), pp. 72–81.
American Society of Tool Engineers National Publication Committee, Tool Engineers Handbook (2nd edition, 1959), pp. 12-11 to 12-15.

Primary Examiner—Kenneth M. Schor
Assistant Examiner—Charles K. Friedman
Attorney, Agent, or Firm—Sughrue, Mion, Zinn, Macpeak & Seas

[57] ABSTRACT

A coating apparatus in which a series of substrates are conveyed along a predetermined path for receiving coating solution in which coating is carried out stably and coatings of uniform thickness are formed. A solution supplying unit is arranged above the path of the substrates. A flexible, elastic solid curtain member made of a water-impermeable material is attached to an outlet of said solution supplying unit, a front edge of which elastically contacts the substrates as they pass beneath the solution supplying unit so that coating solution flowing out of said solution supplying unit is applied to the substrates from the curtain member. A vertically movable solution receiver is positioned below the front edge of the curtain member with the solution receiver contacting the front edge of the curtain member when no substrate is located between the curtain member and the solution receiver so as to allow the coating solution to smoothly flow down the solution receiver.

17 Claims, 5 Drawing Sheets

COATING APPARATUS WITH VERTICALLY MOVABLE SOLUTION RECEIVER

BACKGROUND OF THE INVENTION

The present invention relates to a coating apparatus for coating the surfaces of a series of substrates with coating solution uniformly, and more particularly to a coating apparatus for coating a series of relatively short substrates such as glass plates, aluminum plates, zinc plates or plastic sheets with a coating material such as photo-resist or photographing photosensitive material.

In a conventional method of coating a series of substrates with a coating solution, a flexible, elastic solid curtain member such as a plastic sheet, metal foil, paper or cloth is fastened to the end of a solution supplying unit, and with the end of the solid curtain thus fastened held in contact with the substrate, the coating solution supplied from the solution supplying unit is applied to the substrate (see, for example, Japanese Patent Application Publication No. 16214/1976).

If a multi-layer coating operation is carried out using a solution supplying unit operating according to a method which is adapted to form a plurality of coating solution layers simultaneously, the coating solution layers tend to mix with one another, that is, it is difficult to form coating solution layers uniformly, and the layers on the front end portion of each substrate are thicker than those on the remaining portion (hereinafter referred to as a "steady portion" when applicable).

Moreover, the method is disadvantageous in that there is a tendency for the layer of coating solution formed on the substrate to be not uniform in thickness, namely, the coating solution layer on the front end portion of the substrate is thicker than on the remaining steady portion, and stripes are formed in the layer of coating solution on the remaining steady portion.

FIG. 10 shows a conventional dual layer coating apparatus of the solid curtain type. FIG. 10 shows the coating apparatus in an operating mode in which one substrate 301 has been coated with coating solutions, and the following substrate 310 is next to be coated.

Coating solutions 304 and 314 flowing down a solid curtain 305 form a solution pool 308 along the front edge of the solid curtain 305 while mixing with each other, and drop from the solution pool 308 irregularly. As a result, the coating solution layer formed on the substrate 310 is irregular in thickness; that is, the substrate 310 is coated heavier in its front end portion than in the remaining portion, and in addition the two coating solution layers are mixed on the latter.

FIG. 11 shows another conventional solid curtain type coating apparatus. More specifically, FIG. 11 shows a mode of operation of the coating apparatus in which a substrate 101 has been coated with a coating solution 104, and the next 110 is going to be coated.

The coating solution supplied from a solution supplying unit 103 flows down a solid curtain 105 while forming a solution pool 108 at the front edge of the solid curtain 105, and drops irregularly from the solution pool 108. Hence, in the front end portion of the following substrate 110, the coating solution layer formed thereon is not uniform in thickness in the widthwise direction, and in the remaining steady portion, longitudinal stripes are formed in correspondence to the solution dropping pattern 109.

SUMMARY OF THE INVENTION

Accordingly, an object of the invention is to provide a solid curtain type multi-layer coating apparatus which is able to simultaneously form a plurality of coating solution layers uniformly on substrates without those layers mixing with one another, and is free from the difficulty that the coating solution layers on the front end portion of a substrate are thicker than those on the remaining steady portion.

Another object of the invention is to provide a coating apparatus which is free from the above-described difficulty that the layer of coating solution formed on a substrate is not uniform, that is, the layer of coating solution on the front end portion of the substrate is thicker than that on the remaining steady portion, and stripes are formed in the layer of coating solution on the remaining steady portion.

In a coating operation using a solid curtain, in the case where the top of a series of substrates is to be coated, or the solid curtain arrives at the space between adjacent substrates, application of the coating solution to the substrates is suspended. Even in such a case, steady supply of the coating solution is maintained so as to eliminate the difficulty that the solid curtain is dried or the coating solution flows irregularly down the solid curtain.

The inventors have conducted intensive research on the reason why the above-described difficulties are caused in the solid curtain type coating operation, and found the following:

In a solid curtain type coating method of forming a plurality of coating solution layers simultaneously:

(1) In the case where the solid curtain is made of a water-permeable material, the coating solution layers are liable to mix with one another in the solid curtain.

(2) The coating solutions supplied while the substrate coating operation is suspended are mixed with one another while forming a solution pool along the lower edge of the solid curtain, so that the coating solution layers while being mixed are formed even on the steady portion of the following substrate.

(3) The coating solutions supplied and pooled along the lower edge of the solid curtain in the same manner are applied to the front end portion of the following substrate, as a result of which the coating solution layers formed on the substrate are not uniform in thickness; that is, the coating solution layers formed on the front end portion are heavier than those on the remaining steady portion.

On the other hand, in a coating operation using a solid curtain, in the case where the top of a series of substrate is to be coated, or the solid curtain arrives at the space between adjacent substrates, application of the coating solution to the substrates is suspended. Even in such a case, the coating solution is maintained supplied so as to eliminate the difficulties of the solid curtain drying and the coating solution flowing irregularly down the solid curtain.

The inventors have conducted further intensive research on the reason why the above-described difficulties occur in the solid curtain type coating operation, and discovered the following: The difficulty that the coating solution layer on the front end portion of the substrate is larger in thickness is due to the fact that the coating solution supplied while application of the coating material is suspended tends to pool at the lower edge of the solid curtain, and the coating solution thus pooled is applied to the front end portion of the substrate. The difficulty that stripes are formed in the coating solution layer on the steady portion of the substrate is caused by the fact that the coating solution drops from the pool irregularly, whereby the flow of coating solution in the solid curtain is irregular and the lower edge of the solid curtain is wetted irregularly.

The foregoing and other objects of the invention have been achieved by the provision of a coating apparatus comprising: a solution supplying unit for supplying a plurality of coating solutions and which is arranged above a series of conveyed substrates; and an flexible, elastic solid curtain member fastened to the outlet of the solution supplying unit and arranged in such a manner that the front edge thereof is in contact with the substrate so that the coating solutions flowing out of the solution supplying unit are applied to the substrates, in which, according to the invention, the solid curtain member is made of a water-impermeable material, and a solution receiver is provided below the front edge of the solid curtain member arranged in such a manner that the solution receiver is vertically movable, the solution receiver contacting the front edge of the solid curtain member to allow the coating solution to smoothly flow down. Preferably, the solution receiver has a solution contact portion made of a water-permeable material.

DESCRIPTION OF THE PREFERRED EMBODIMENTS

Preferred embodiments of the invention will now be described with reference to the accompanying drawings.

Figure 1:
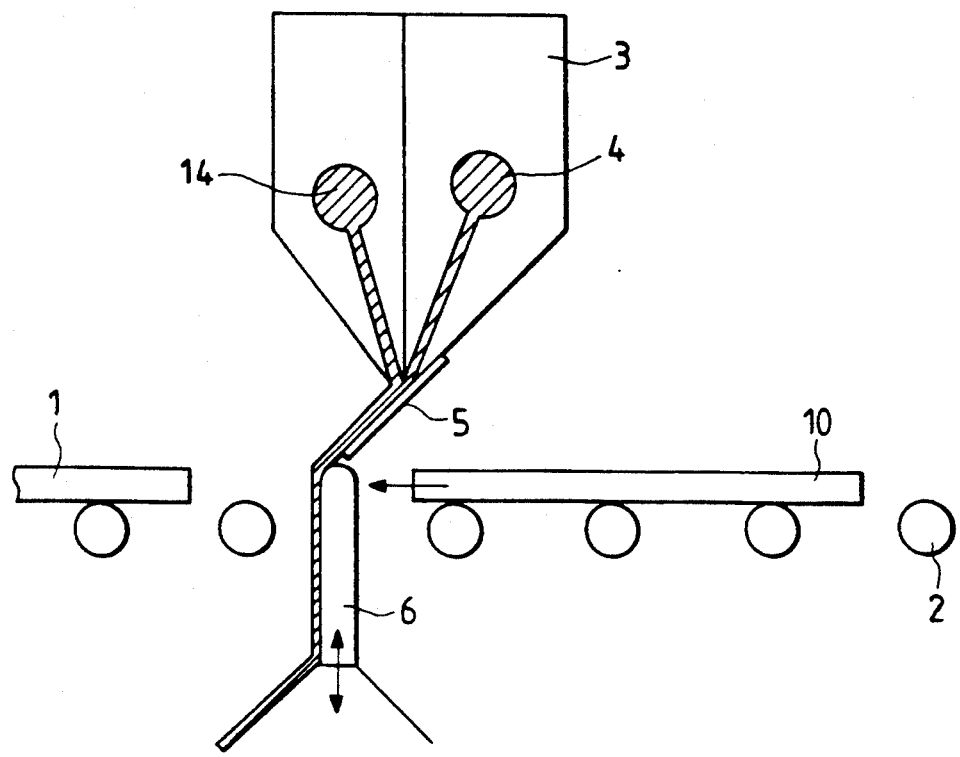
FIG. 1 is an explanatory diagram showing an extrusion type coating apparatus constructed in accordance with the invention in an operating mode in which application of coating solutions to substrates is suspended.
Figure 2:
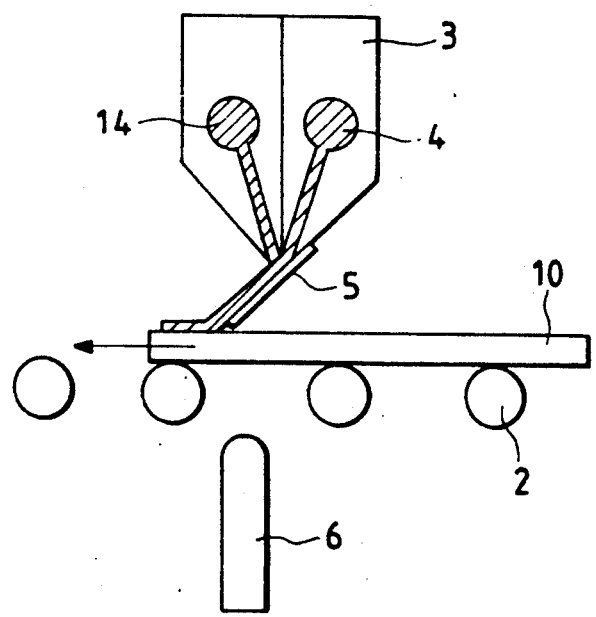
FIG. 2 is an explanatory diagram showing the coating apparatus of FIG. 1 in an operating mode in which the coating solutions are applied to one of the substrates.

FIGS. 1 and 2 show a first preferred embodiment of the invention.

In this embodiment, a solution receiver 6 is arranged in such a manner that it can be moved vertically by operating a vertical moving unit (not shown). When the coating solutions are not to be applied to the substrate (as shown in FIG. 1), the solution receiver 6 is set at its upper position; that is, it is in contact with the front edge of the solid curtain 5 to allow the coating solutions 4 and 14 to flow down it. When the coating solutions are to be applied to the substrate (as shown in FIG. 2), the solution receiver 6 is moved to its lower position so that it is not in contact with the substrate 10.

When the solution receiver 6 is set as shown in FIG. 1, the coating solutions 4 and 14 flowing down the solid curtain 5 are allowed to flow smoothly to the solution receiver 6 through the front edge of the solid curtain. Hence, the coating solutions form no solution pool along the front edge of the solid curtain and will not mix with each other. Therefore, the coating apparatus of the invention is free from the difficulties that the front end portion of the substrate is coated heavier and the two coating solution layers are mixed in the steady portion of the latter.

Figure 3:
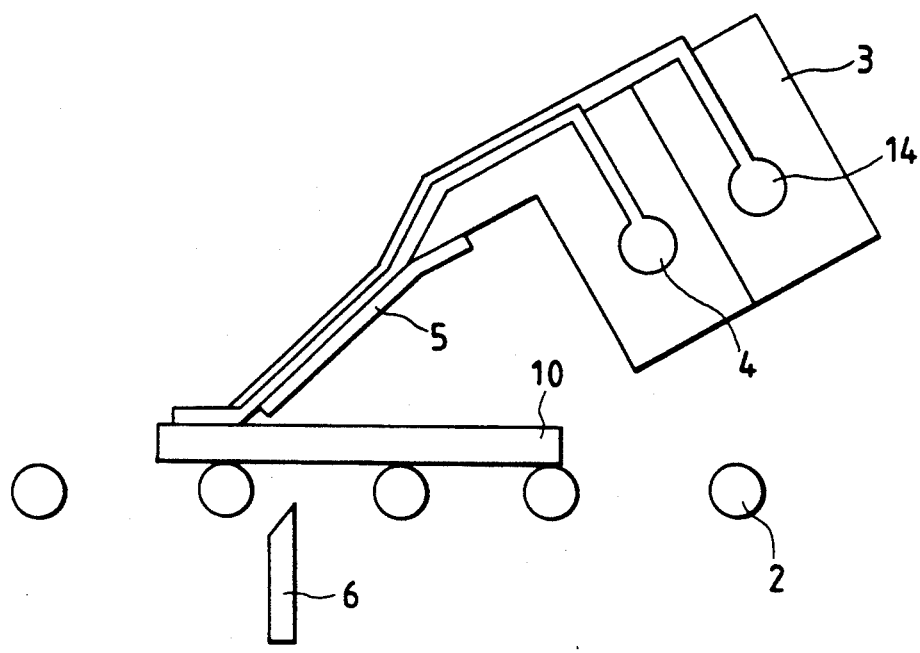
FIG. 3 is an explanatory diagram showing a slide hopper type coating apparatus, constructed in accordance with another embodiment of the invention.

In the case of FIG. 1, an extrusion type solution supplying unit 3 is employed to supply a plurality of coating solutions in the form of layers; however, the invention is not limited thereto or thereby. For instance, FIG. 3 shows a slide hopper type solution supplying unit.

In the above-described embodiment, two coating solutions are employed. However, it should be noted that the technical concept of the invention is applicable to the case where more than two coating solutions are used.

The solid curtain 5 is in the form of a flat plate which is flexible and elastic. For a multi-layer coating operation, a solid curtain which is not water-permeable should be used because a water-permeable solid curtain may cause a plurality of coating solution layers to mix with one another.

The solid curtain is made of a material which is excellent in terms of its wettability with respect to the coating solutions and high in chemical durability against these solutions. Preferably, the solid curtain is made of a plastic sheet, particularly a polyethylene terephthalate sheet 50 to 200 μm in thickness.

Figure 4:
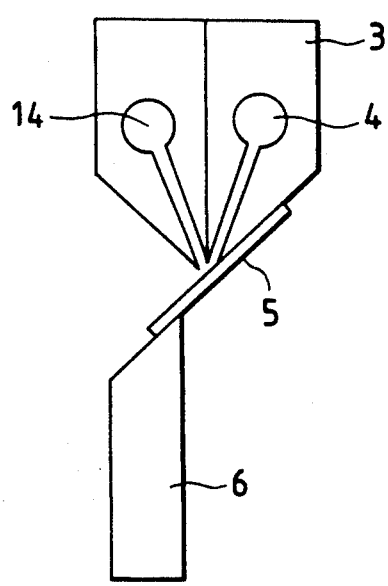
FIG. 4 is an explanatory diagram showing an example of a solution receiver of a linear slope type in the coating apparatus of FIG. 1.
Figure 4A:
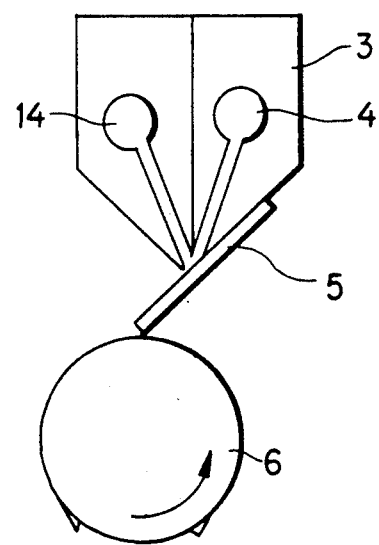
FIG. 4a is an explanatory diagram showing an example of a solution receiver of a rotary roller in the coating apparatus of FIG. 1.

The configuration of the solution receiver 6 is not limited; however, the latter should be shaped so as not to obstruct the flow of the coating solutions. More specifically, it should be so shaped that, when the solution receiver is brought into contact with the solid curtain, the latter is the same in configuration as when the substrate is coated with the solution receiver retracted. For this purpose, it is desirable to use a solution receiver of the linear slope type, as shown in FIG. 4, or a solution receiver of the curved type, as shown in FIG. 1;

otherwise, a solution receiver of rotary roller type may be employed, as shown in FIG. 4a.

The material of the solution receiver 6 is not limited; however, it is preferable that it be made of a material which is high both in terms of its wettability with the coating solutions and in corrosion resistance against them. For this purpose, it is desirable that it be made of stainless steel, for instance.

The position of the solution receiver 6 is determined as follows: The upper position of the solution receiver should be so that the position and configuration of the front end portion of the solid curtain 5 relative to the solution receiver is substantially the same as -the position and configuration of the front end portion of the solid curtain 5 relative to the substrate when the substrate is coated. This is to eliminate the difficulty that, when the solid curtain 5 contacts the next substrate 10 from the solution receiver 6, the flow of coating solutions on the solid curtain 5 is disturbed, whereby the coating solution layers formed on the substrate become non-uniform in thickness.

The solution receiver 6 receives the coating solutions intermittently, as a result of which the latter tend to adhere to the solution receiver. Therefore, the adhering coating solutions tend to solidify with time. In order to eliminate this difficulty, it is desirable to provide a washing device for washing the solution receiver 6 with water or the like while the latter is at the lower position.

Figure 5:
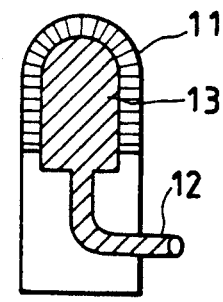
FIG. 5 is an explanatory diagram showing an example of a solution receiver made of water-permeable material.

FIG. 5 shows another example of the solution receiver 6.

This solution receiver, as shown in FIG. 5, has a solution contact portion 11 which is made of a water-permeable material such as porous ceramic. Water is supplied in small amounts to the solution contact portion 11 through a water supplying inlet 12 and a water pocket 13 at all times.

The solution receiver thus constructed is maintained uniformly wetted in the widthwise direction so that the solidification of coating solutions thereon is effectively prevented. Also, it is applicable that the solution receiver 6 employs a plurality of holes and/or a slit like aperture to allow water to flow down from the holes and/or the aperture, resulting in the same efficiency described above.

COMPARISON EXAMPLE 1

Figure 10:
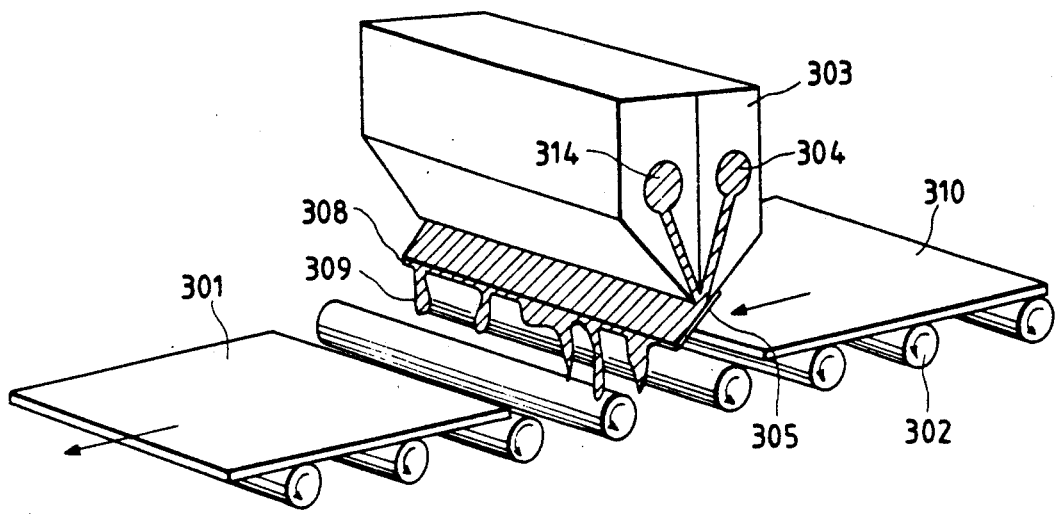
FIG. 10 is a perspective view depicting the general arrangement of a conventional solid curtain type coating apparatus for forming two coating solution layers simultaneously.

A conventional coating apparatus as shown in FIG. 10 was used to coat glass plates with a first coating solution of photographic photosensitive material and a second coating solution for forming a protective layer, to thereby form wet films 70 μm and 30 μm in thickness, respectively. The glass plates were each 50 cm in length and 2 mm in thickness, and were conveyed successively at a spacing interval of 10 cm at a speed of 3.0 m/min. The first coating solution had a viscosity of 10 cps, and a surface tension of 48 dyne/cm, and the second coating solution a viscosity of 12.5 cps and a surface tension of 40 dyne/cm.

The solid curtain used in this example was a sheet of PET (polyethylene terephthalate) 20 mm in length and 100 μm in thickness.

In this case, the heavier coating solution layers formed on the front end portion of the substrate was about 50 mm in average width, and the maximum film thickness was about four times as large as that of the remaining steady portion. In addition, the coating solution layers were mixed with each other, thus forming irregular coatings even in the steady portion.

INVENTIVE EXAMPLE 1

With a coating apparatus constructed in accordance with the invention as shown in FIG. 1, a coating operation was carried out using the same substrates, coating solutions (the same in physical properties and film thickness), and solid curtain and operating conditions as in the above-described.

COMPARISON EXAMPLE 1

In the coating operation, a stainless steel solution receiver of a curved type as shown in FIG. 1 was used.

In this case, the heavier coating solution layers on the front end portion of the substrate were about 5 mm in average width, and the maximum film thickness thereof was about 1.3 times as large as that of the steady portion. No irregular coating due to the mixing of coating solution layers was detected in the steady portion.

Figure 6:
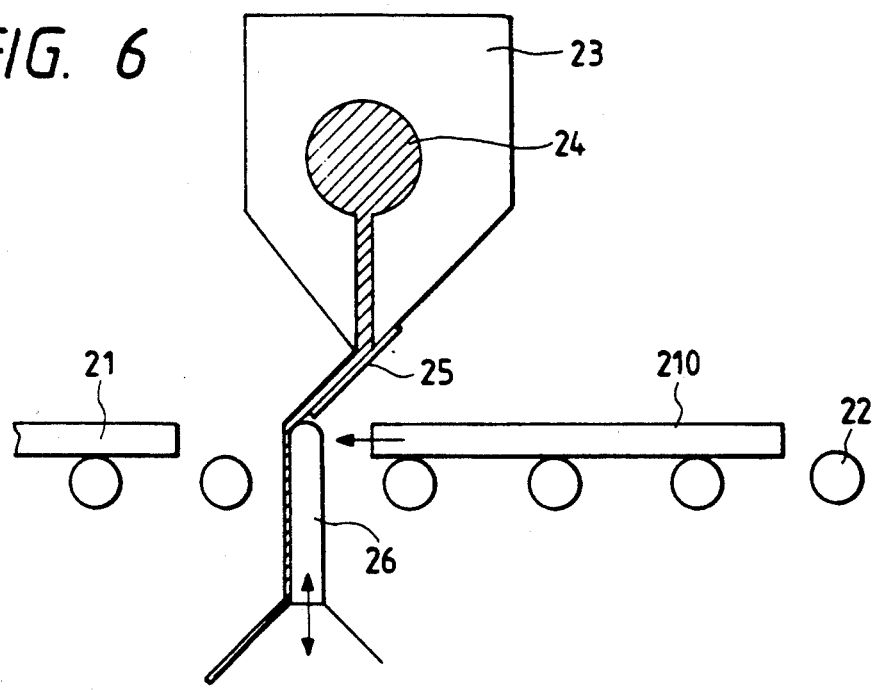
FIG. 6 is an explanatory diagram showing a coating apparatus constructed according to the invention in an operating mode in which a substrate is not to be coated and in which a solution receiver, being set at its upper position, is in contact with a solid curtain.
Figure 7:
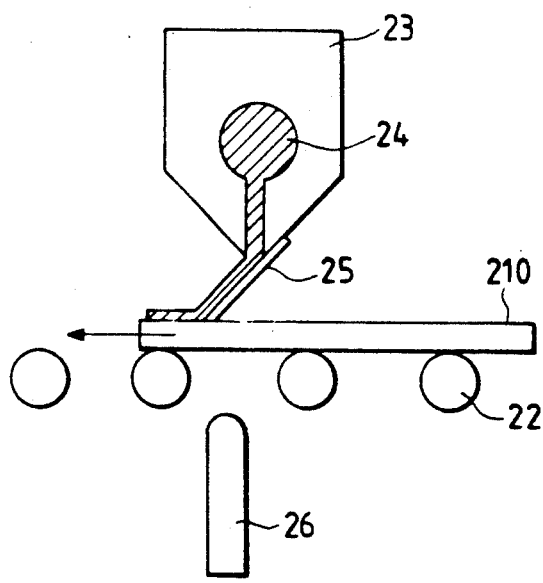
FIG. 7 is also an explanatory diagram showing another operating mode of the coating apparatus which occurs when the substrate is to be coated, in which the solution receiver is set at its lower position, thus allowing a coating operation with the solid curtain in contact with the substrate.

FIGS. 6 and 7 shows another embodiment of this invention.

In this embodiment, a solution receiver 26 is arranged in such a manner that it is movable vertically by a vertical moving unit (not shown). When a substrate is not to be coated with a coating solution (FIG. 6), the solution receiver 26 is set at its upper position to contact the front edge of a solid curtain 25, thereby to assist the dropping of the coating solution 24 from the solid curtain 25. When the substrate is to be coated with the coating solution (FIG. 7), the solution receiver 26 is moved to its lower position so that it is not in contact with the substrate.

In the operational mode of the coating apparatus as shown in FIG. 6, the coating solution flowing down the solid curtain is allowed to flow down the solution receiver 26 while dropping from the front edge of the solid curtain. Hence, no solution pool is formed at the front edge of the solid curtain, and the flow of the coating solution is distributed uniformly in the width direction. Accordingly, the coating apparatus is free from the difficulties of the coating solution layer formed in the front end portion of the next substrate being larger in thickness than the remaining steady portion and stripes being formed in the coating solution layer on the latter.

Figure 8:
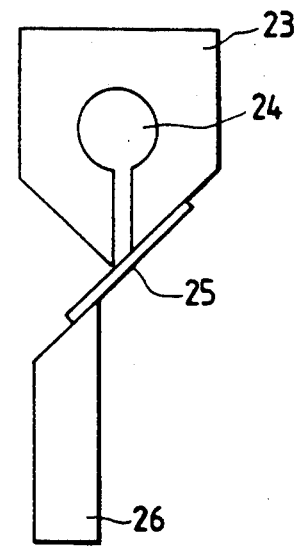
FIG. 8 is an explanatory diagram showing another example of a solution receiver, here of the linear slope type.

The solution receiver 26 may be of any form as long as it allows the coating solution to smoothly flow down it. However, it is preferable that the solution receiver be shaped so that, when the front edge of the solid curtain contacts it, its shape is the same as that when the substrate is to be coated. For instance, the shape may be of a linear slope type as shown in FIG. 8, or of a curved type as shown in FIG. 6. Alternatively, a rotary roller may be employed as the solution receiver.

The solution receiver may be made of a material which is readily wetted with a coating solution and is chemically durable against the coating solution. Preferably, the solution receiver is made of stainless steel or plastic material.

When the substrate is not to be coated, the solution receiver 26 is positioned so that the position of the front edge of the solid curtain is substantially the same as that of the front edge of the solid curtain provided when the substrate is to be coated. This is done to minimize the variation in the thickness of the coating solution layer by the solid curtain when the latter (solid curtain) contacts the substrate from the solution receiver.

Figure 9:
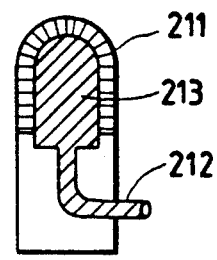
FIG. 9 is an explanatory diagram shown another example of a solution receiver made of water-permeable material.

FIG. 9 shows another example of a solution receiver in the coating apparatus according to the invention.

The solution receiver, as shown in FIG. 9, has a solution contact portion 211 made of a water-permeable material such as porous ceramic. Water is supplied in small amounts to the solution contact portion 211 through a water supplying inlet 212 and a water pocket 213 at all times.

The solution receiver thus constructed is uniformly wetted in the widthwise direction so that the solidification of coating solution thereon is effectively prevented. Also, it is applicable that the solution receiver 6 employs a plurality of holes and/or a slit like aperture to allow water to flow down from the holes and/or the aperture, resulting in the same efficiency described above.

COMPARISON EXAMPLE 2

Figure 11:
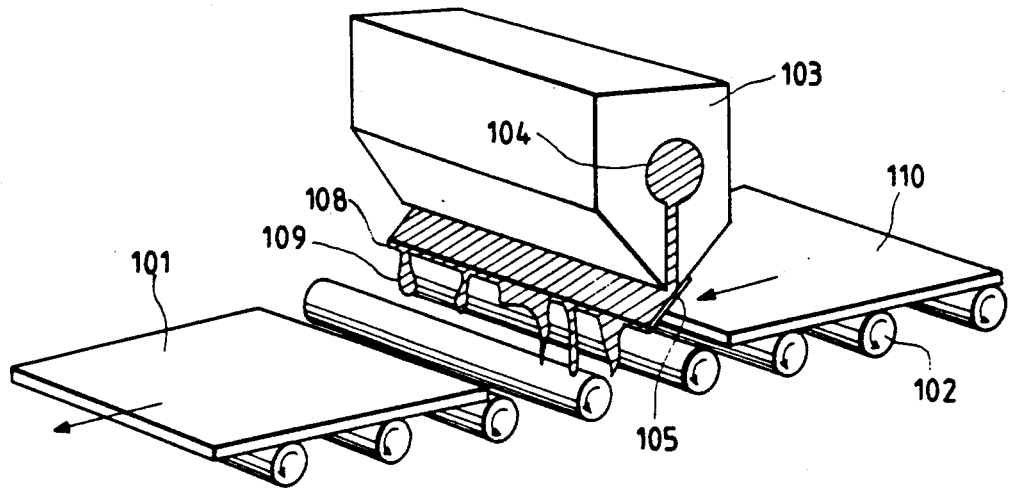
FIG. 11 is a perspective view showing the arrangement of a conventional solid curtain type coating apparatus.

A conventional coating apparatus as shown in FIG. 11 was used to coat glass plates with a coating solution of photographic photosensitive material. The glass plates were each 50 cm in length and 2 mm in thickness, and conveyed successively at a spacing interval of 10 cm at a speed of 3.0 m/min. The coating solution had a viscosity of 10 cps and a surface tension of 48 dyne/cm.

The solid curtain used in this examples was a sheet of PET (polyethylene terephthalate) 20 mm in length and 100 $\mu$m in thickness.

In this case, the heavier coating solution layer formed on the glass plate was about 50 mm in average width, and the maximum film thickness was about four times as large as that of the remaining steady portion. In addition, with about 30% maximum film thickness variation, longitudinal stripes were formed in the coating solution layer in the steady portion.

INVENTIVE EXAMPLE 2

With the coating apparatus of the invention as shown in FIG. 6, a coating operation was carried out using the same substrate, coating solution, and solid curtain and operating conditions as those in the above-described Comparison Example 2.

In the coating operation, a stainless steel solution receiver of the curved type as shown in FIG. 6 was used.

In this case, the heavier coating solution layer on the front end portion of the substrate was about 5 mm in average width, and the maximum film thickness thereof was about 1.3 times as large as that of the steady portion. No longitudinal stripes were formed in the coating solution layer in the steady portion.

INVENTIVE EXAMPLE 3

A solution receiver made of water-permeable material such as porous ceramic as shown in FIG. 9 was employed. Water was supplied at a flow rate of 5 cc/min. The other conditions were the same as those in the above-described Inventive Example 2.

In this case, the average width of the heavier portion and the maximum film thickness were substantially equal to those in Inventive Example 1. The coating operation were carried out stably for a long period of time.

What is claimed is:

1. A coating apparatus comprising:
   means for conveying a series of substrates along a predetermined path for receiving at least one coating solution thereon;
   a solution supplying unit arranged above said path of said substrates for supplying at least one coating solution onto said substrates;
   a flexible, elastic solid curtain member attached to an outlet of said solution supplying unit, a front edge of said curtain member elastically contacting said substrates as said substrates pass beneath said solution supplying unit so that said at least one coating solution flowing out of said solution supplying unit is applied to said substrates from said curtain member, said curtain member being constructed of a water-impermeable material; and
   a vertically movable solution receiver having a first position below said substrates as said substrates pass beneath said solution supplying unit, said solution receiver having a second position wherein said solution receiver contacts said front edge of said curtain member when no substrate is located between said curtain member and said solution receiver, so as to allow said at least one coating solution to smoothly flow down said solution receiver.

2. The coating apparatus as claimed in claim 1, in which said solution receiver has a solution contact portion constructed of a water-permeable material.

3. The coating apparatus of claim 2, wherein said water-permeable material is a porous ceramic.

4. The coating apparatus as claimed in claim 1, wherein said solution supplying unit supplies a plurality of coating solutions.

5. The coating apparatus as claimed in claim 1, wherein said solution supplying unit is an extrusion type solution supplying unit.

6. The coating apparatus as claimed in claim 1, wherein said solution supplying unit is a slide hopper type solution supplying unit.

7. The coating apparatus as claimed in claim 1, wherein said curtain member is made of a material readily wettable with said at least one coating solution.

8. The coating apparatus as claimed in claim 1, wherein said curtain member is made of a polyethylene terephthalate sheet.

9. The coating apparatus as claimed in claim 8, wherein said polyethylene terephthalate sheet has a thickness in a range of 50 to 200 $\mu$m.

10. The coating apparatus as claimed in claim 1, wherein a top end portion of said solution receiver contacting said solid curtain member is flat and sloped downward with respect to a direction of conveyance of said substrates.

11. The coating apparatus as claimed in claim 1, wherein a top end portion of said solution receiver contacting said solid curtain member is rounded.

12. The coating apparatus as claimed in claim 1, wherein said solution receiver comprises a rotary roller.

13. The coating apparatus as claimed in claim 1, wherein said solution receiver is made of stainless steel.

14. The coating apparatus as claimed in claim 1, wherein said solution receiver has a solution contact portion constructed of a water-permeable material, and further comprising means for supplying a flow of water to said solution contact portion through said water-permeable material.

15. The coating apparatus as claimed in claim 14, wherein said means for supplying said flow of water comprises a water pocket formed within said solution receiver, and a water supplying tube for supplying water to said water pocket.

16. The coating apparatus of claim 15, wherein said water-permeable material is a porous ceramic.

17. The coating apparatus as claimed in claim 1, wherein said solution supplying unit supplies a single coating solution.

* * * * *